US011208722B2

(12) United States Patent
White et al.

(10) Patent No.: US 11,208,722 B2
(45) Date of Patent: *Dec. 28, 2021

(54) VAPOR FLOW CONTROL APPARATUS FOR ATOMIC LAYER DEPOSITION

(71) Applicant: ASM IP Holding B.V., Almere (NL)

(72) Inventors: Carl L. White, Gilbert, AZ (US); Eric Shero, Phoenix, AZ (US)

(73) Assignee: ASM IP HOLDING B.V., Almere (NL)

( * ) Notice: Subject to any disclaimer, the term of this patent is extended or adjusted under 35 U.S.C. 154(b) by 446 days.

This patent is subject to a terminal disclaimer.

(21) Appl. No.: 15/177,210

(22) Filed: Jun. 8, 2016

(65) Prior Publication Data
US 2016/0281232 A1    Sep. 29, 2016

Related U.S. Application Data

(62) Division of application No. 13/337,604, filed on Dec. 27, 2011, now Pat. No. 9,388,492.

(51) Int. Cl.
*C23C 16/455* (2006.01)
*C23C 16/44* (2006.01)

(52) U.S. Cl.
CPC .... *C23C 16/45525* (2013.01); *C23C 16/4402* (2013.01); *C23C 16/4408* (2013.01); *C23C 16/45544* (2013.01); *C23C 16/45561* (2013.01)

(58) Field of Classification Search
CPC .......... C23C 16/4402; C23C 16/45561; C23C 16/4408; C23C 16/45544; C23C 16/45525

See application file for complete search history.

(56) References Cited

U.S. PATENT DOCUMENTS

| | | |
|---|---|---|
| 4,401,052 A | 8/1983 | Baron et al. |
| 4,747,367 A | 5/1988 | Posa |
| 4,828,224 A | 5/1989 | Crabb et al. |
| 4,889,609 A | 12/1989 | Cannella |
| 4,895,107 A | 1/1990 | Yano et al. |

(Continued)

FOREIGN PATENT DOCUMENTS

| | | |
|---|---|---|
| DE | 3715644 | 12/1988 |
| JP | H09-186111 | 7/1997 |

(Continued)

OTHER PUBLICATIONS

Office Action for Chinese Patent Application No. 200780002793.9, dated Mar. 15, 2010.

(Continued)

*Primary Examiner* — Jeffrie R Lund

(74) *Attorney, Agent, or Firm* — Knobbe, Martens, Olson & Bear LLP

(57) ABSTRACT

A device for performing ALD includes a housing having a vacuum chamber that surrounds a horizontal flow reactor. The device further includes a gas distribution system for delivering gases to the reactor. The gas distribution system includes at least one of a high temperature valve and a high temperature filter disposed inside the vacuum chamber. The high temperature valve (and/or filter) controls (and/or filters) a supply of a precursor/reactant gas, inert gas, or precursor/reactant and inert gas mixture before it enters the horizontal flow reactor.

22 Claims, 10 Drawing Sheets

(56) References Cited

U.S. PATENT DOCUMENTS

| | | |
|---|---|---|
| 4,907,534 A | 3/1990 | Huang et al. |
| 4,949,783 A | 8/1990 | Lakios et al. |
| 4,951,601 A | 8/1990 | Maydan et al. |
| 4,990,047 A | 2/1991 | Wagner et al. |
| 5,071,460 A | 12/1991 | Fujiura et al. |
| 5,080,549 A | 1/1992 | Goodwin et al. |
| 5,121,705 A | 6/1992 | Sugino |
| 5,166,092 A | 11/1992 | Mochizuki et al. |
| 5,186,718 A | 2/1993 | Tepman et al. |
| 5,192,371 A | 3/1993 | Shuto et al. |
| 5,199,483 A | 4/1993 | Bahng |
| 5,217,501 A | 6/1993 | Fuse et al. |
| 5,223,001 A | 6/1993 | Saeki |
| 5,229,615 A | 7/1993 | Brune et al. |
| 5,248,253 A | 9/1993 | Philipossian et al. |
| 5,284,519 A | 2/1994 | Gadgil |
| 5,286,296 A | 2/1994 | Sato et al. |
| 5,288,327 A | 2/1994 | Bhat |
| 5,350,453 A | 9/1994 | Scholosser |
| 5,388,944 A | 2/1995 | Takanabe et al. |
| 5,391,035 A | 2/1995 | Krueger |
| 5,433,785 A | 7/1995 | Saito |
| 5,462,397 A | 10/1995 | Iwabuchi |
| 5,488,925 A | 2/1996 | Kumada |
| 5,516,732 A | 5/1996 | Flegal |
| 5,520,742 A | 5/1996 | Ohkase |
| 5,520,743 A | 5/1996 | Takahashi |
| 5,525,157 A * | 6/1996 | Hawkins ............... C23C 16/455 118/715 |
| 5,538,390 A | 7/1996 | Salzman |
| 5,571,330 A | 11/1996 | Kyogoku |
| 5,586,585 A | 12/1996 | Bonora et al. |
| 5,601,651 A | 2/1997 | Watabe |
| 5,609,459 A | 3/1997 | Muka |
| 5,728,223 A | 3/1998 | Murakami et al. |
| 5,755,878 A | 5/1998 | Habuka et al. |
| 5,789,027 A | 8/1998 | Watkins et al. |
| 5,938,840 A | 8/1999 | Habuka et al. |
| 5,951,771 A | 9/1999 | Raney et al. |
| 6,036,783 A | 3/2000 | Fukunaga et al. |
| 6,070,550 A | 6/2000 | Ravi et al. |
| 6,079,353 A | 6/2000 | Leksell et al. |
| 6,114,227 A | 9/2000 | Leksell et al. |
| 6,224,676 B1 | 5/2001 | Nakajima et al. |
| 6,299,692 B1 | 10/2001 | Ku et al. |
| 6,302,965 B1 | 10/2001 | Umotoy et al. |
| 6,303,501 B1 | 10/2001 | Chen et al. |
| 6,534,133 B1 | 3/2003 | Kaloyeros et al. |
| 6,539,891 B1 * | 4/2003 | Lee .................... C23C 16/4405 118/715 |
| 6,660,177 B2 | 12/2003 | Carr |
| 6,783,590 B2 | 8/2004 | Lindfors et al. |
| 6,846,516 B2 | 1/2005 | Yang et al. |
| 6,881,263 B2 | 4/2005 | Lindfors et al. |
| 6,884,296 B2 | 4/2005 | Basceri et al. |
| 6,899,507 B2 | 5/2005 | Yamagishi et al. |
| 6,905,547 B1 | 6/2005 | Londergan et al. |
| 6,916,398 B2 | 7/2005 | Chen et al. |
| 7,021,881 B2 | 4/2006 | Yamagishi et al. |
| 7,163,587 B2 | 1/2007 | Kinnard et al. |
| 7,175,713 B2 | 2/2007 | Thakur et al. |
| 7,195,037 B2 | 3/2007 | Eidsmore |
| 7,204,886 B2 | 4/2007 | Chen et al. |
| 7,297,892 B2 | 11/2007 | Kelley et al. |
| 7,304,263 B2 | 12/2007 | Chang et al. |
| 7,311,851 B2 | 12/2007 | Carr |
| 7,402,210 B2 | 7/2008 | Chen et al. |
| 7,408,225 B2 | 8/2008 | Shinriki et al. |
| 7,591,907 B2 | 9/2009 | Chen et al. |
| 7,591,957 B2 | 9/2009 | Carr |
| 7,670,399 B2 | 3/2010 | Park |
| 7,780,785 B2 | 8/2010 | Chen et al. |
| 7,780,789 B2 | 8/2010 | Wu et al. |
| 7,918,938 B2 | 4/2011 | Provencher et al. |
| 8,070,879 B2 | 12/2011 | Chen et al. |
| 8,137,463 B2 | 3/2012 | Liu et al. |
| 8,152,922 B2 | 4/2012 | Schmidt et al. |
| 8,211,230 B2 | 7/2012 | Verghese et al. |
| 8,298,336 B2 | 10/2012 | Wang et al. |
| 8,372,201 B2 | 2/2013 | Provencher et al. |
| 8,425,682 B2 | 4/2013 | Wang et al. |
| 8,465,801 B2 | 6/2013 | Schmidt et al. |
| 8,668,776 B2 | 3/2014 | Chen et al. |
| 8,784,563 B2 | 7/2014 | Schmidt et al. |
| 9,312,154 B2 * | 4/2016 | Tran .................... C23C 16/4401 |
| 9,359,672 B2 * | 6/2016 | Verghese ............ C23C 16/4408 |
| 9,388,492 B2 * | 7/2016 | White ................. C23C 16/4402 |
| 9,394,608 B2 * | 7/2016 | Shero ................. C23C 16/45502 |
| 9,567,672 B2 * | 2/2017 | Kim .................. C23C 16/45591 |
| 9,574,268 B1 | 2/2017 | Dunn et al. |
| 10,280,509 B2 * | 5/2019 | Tzu ..................... C23C 16/45512 |
| 10,468,291 B2 * | 11/2019 | Verghese ........... C23C 16/45582 |
| 10,480,072 B2 * | 11/2019 | Shero ................ C23C 16/45544 |
| 10,844,486 B2 * | 11/2020 | Shero ................ C23C 16/45504 |
| 2001/0003015 A1 | 6/2001 | Chang et al. |
| 2001/0006093 A1 | 7/2001 | Tabuchi et al. |
| 2001/0054377 A1 * | 12/2001 | Lindfors ............. C23C 16/4402 117/104 |
| 2002/0007790 A1 | 1/2002 | Park |
| 2002/0072164 A1 | 6/2002 | Umotoy et al. |
| 2002/0081381 A1 | 6/2002 | DelaRosa et al. |
| 2002/0195055 A1 | 12/2002 | Grant et al. |
| 2003/0010451 A1 | 1/2003 | Tzu et al. |
| 2003/0019428 A1 | 1/2003 | Ku et al. |
| 2003/0056720 A1 | 3/2003 | Dauelsberg et al. |
| 2003/0070620 A1 | 4/2003 | Cooperberg et al. |
| 2003/0079686 A1 | 5/2003 | Chen et al. |
| 2003/0101938 A1 | 6/2003 | Ronsse et al. |
| 2003/0106643 A1 | 6/2003 | Tabuchi et al. |
| 2003/0172872 A1 | 9/2003 | Thakur et al. |
| 2003/0180460 A1 | 9/2003 | Strauch et al. |
| 2004/0002881 A1 | 2/2004 | Grant et al. |
| 2004/0035358 A1 | 2/2004 | Basceri et al. |
| 2004/0118342 A1 | 6/2004 | Cheng et al. |
| 2004/0144311 A1 | 7/2004 | Chen et al. |
| 2004/0221807 A1 * | 11/2004 | Verghese ............... B82Y 30/00 118/715 |
| 2005/0000428 A1 | 1/2005 | Shero et al. |
| 2005/0000656 A1 | 1/2005 | Carr |
| 2005/0009325 A1 | 1/2005 | Chung et al. |
| 2005/0092247 A1 | 5/2005 | Schmidt et al. |
| 2005/0173068 A1 | 8/2005 | Chen et al. |
| 2005/0208217 A1 | 9/2005 | Shinriki et al. |
| 2005/0241176 A1 * | 11/2005 | Shero .................. C23C 16/4412 34/443 |
| 2005/0252449 A1 | 11/2005 | Nguyen et al. |
| 2005/0263197 A1 | 12/2005 | Eidsmore |
| 2005/0271812 A1 | 12/2005 | Myo et al. |
| 2006/0096540 A1 | 5/2006 | Choi |
| 2006/0266289 A1 | 11/2006 | Verghese et al. |
| 2007/0026147 A1 | 2/2007 | Chen et al. |
| 2007/0095285 A1 | 5/2007 | Thakur et al. |
| 2007/0098894 A1 * | 5/2007 | Verghese ............... B82Y 30/00 427/248.1 |
| 2007/0128864 A1 | 6/2007 | Ma et al. |
| 2007/0187634 A1 | 8/2007 | Sneh |
| 2007/0194470 A1 | 8/2007 | Dedontney |
| 2008/0085226 A1 | 4/2008 | Fondurulia et al. |
| 2008/0102203 A1 | 5/2008 | Wu et al. |
| 2008/0102208 A1 | 5/2008 | Wu et al. |
| 2008/0162580 A1 | 7/2008 | Ben Harush |
| 2008/0202416 A1 | 8/2008 | Provencher et al. |
| 2008/0241387 A1 * | 10/2008 | Keto .................... C23C 16/452 427/255.394 |
| 2009/0196992 A1 | 8/2009 | Schmidt et al. |
| 2010/0003406 A1 | 1/2010 | Lam et al. |
| 2010/0024727 A1 | 2/2010 | Kim et al. |
| 2010/0048032 A1 | 2/2010 | Sangam et al. |
| 2010/0266765 A1 | 10/2010 | White et al. |
| 2010/0310772 A1 | 12/2010 | Tsuda |
| 2011/0098841 A1 | 4/2011 | Tsuda |
| 2012/0079984 A1 | 4/2012 | Schmidt et al. |
| 2012/0289057 A1 | 11/2012 | DeDeontney |
| 2013/0160709 A1 | 6/2013 | White et al. |

(56) References Cited

U.S. PATENT DOCUMENTS

| | | |
|---|---|---|
| 2014/0261178 A1 | 9/2014 | Du Bois et al. |
| 2015/0240359 A1 | 8/2015 | Jdira |
| 2016/0281232 A1* | 9/2016 | White ................. C23C 16/4402 |
| 2017/0121818 A1 | 5/2017 | Dunn et al. |
| 2017/0350011 A1 | 12/2017 | Marquardt |
| 2020/0056286 A1* | 2/2020 | Shero ................. H01L 21/0228 |

FOREIGN PATENT DOCUMENTS

| | | |
|---|---|---|
| JP | 4667541 B2 | 4/2011 |
| WO | WO 90/10092 | 9/1990 |
| WO | WO 01/29282 A2 | 4/2001 |

OTHER PUBLICATIONS

Office Action for Chinese Patent Application No. 200780002793.9, dated Apr. 19, 2011.
Notice for Reasons for Rejection dated Feb. 28, 2012 for Japanese Patent Application No. 2008551324, filed Jul. 16, 2008, 5 pages.

\* cited by examiner

VAPOR FLOW CONTROL APPARATUS FOR ATOMIC LAYER DEPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

This application relates generally to semiconductor processing equipment and specifically to an apparatus for delivering gases in an atomic layer deposition (ALD) device.

Description of the Related Art

There are several vapor deposition methods for depositing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE), which is more recently referred to as Atomic Layer Deposition (ALD).

In an ALD process, one or more substrates with at least one surface to be coated are introduced into the reactor or deposition chamber. The substrate is heated to a desired temperature above the condensation temperature of the selected vapor phase reactants. One reactant is capable of reacting with the adsorbed species of a prior reactant to form a desired product on the substrate surface. The product can be in the form of a film, liner or layer on the substrate.

ALD is a well known process in the semiconductor industry for forming thin films of materials on substrates such as silicon wafers. ALD is a type of vapor deposition wherein a film is built up through deposition of multiple ultra-thin layers with the thickness of the film being determined by the number of layers deposited. In an ALD process, gaseous molecules of one or more compounds (precursors) of the material to be deposited are supplied to the substrate or wafer to form a thin film of that material on the wafer. In one pulse, a first precursor material is adsorbed largely intact in a self-limiting process on the wafer. The process is self-limiting because the vapor phase precursor cannot react with or adsorb upon the adsorbed portion of the precursor. After any remaining first precursor material is removed from the wafer or chamber, the adsorbed precursor material on the substrate may be decomposed or reacted within a subsequent reactant pulse to form no more than a single molecular layer of the desired material. The subsequent reactant may, e.g., strip ligands from the adsorbed precursor material to make the surface reactive again, replace ligands and leave additional material for a compound, etc. In practice, less than a monolayer is formed per cycle on average due to steric hindrance, whereby the size of the precursor molecules prevent access to adsorption sites on the substrate, which may become uncovered through subsequent cycles. Thicker films are produced through repeated growth cycles until the target thickness is achieved.

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by hybridizing CVD and ALD reaction mechanisms. Other variations maybe allow some amount of spatial and/or temporal overlap between the reactants. In ALD and variations thereof, two, three, four or more reactants can be supplied in sequence in a single cycle, and the content of each cycle can be varied to tailor composition.

During a typical ALD process, the reactant pulses, all of which are typically in vapor or gaseous form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. A characteristic feature of ALD is that each reactant is delivered to the substrate until a saturated surface condition is reached. The cycles are repeated to form an atomic layer of the desired thickness. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

SUMMARY OF THE INVENTION

The systems and methods of the present invention have several features, no single one of which is solely responsible for its desirable attributes. Without limiting the scope of this invention as expressed by the claims which follow, its more prominent features will now be discussed briefly. After considering this discussion, and particularly after reading the section entitled "Detailed Description of Preferred Embodiments," one will understand how the features described herein provide several advantages over traditional ALD gas delivery methods and systems.

In accordance with one aspect, an atomic layer deposition (ALD) device is provided. The ALD device includes an ALD reactor and an ALD gas distribution system mounted over the ALD reactor. The gas distribution system is configured to deliver gas to the ALD reactor, wherein the gas distribution system includes reactant and backsuction valves configured to provide inert gas valving (IGV).

In accordance with another aspect, an atomic layer deposition (ALD) device is provided. The ALD device includes a horizontal-flow reactor and a gas distribution system configured to deliver gas to the reactor. The gas distribution system is disposed directly over the reactor, and includes at least one of a valve and a filter.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION OF PREFERRED EMBODIMENTS

Figure 1:
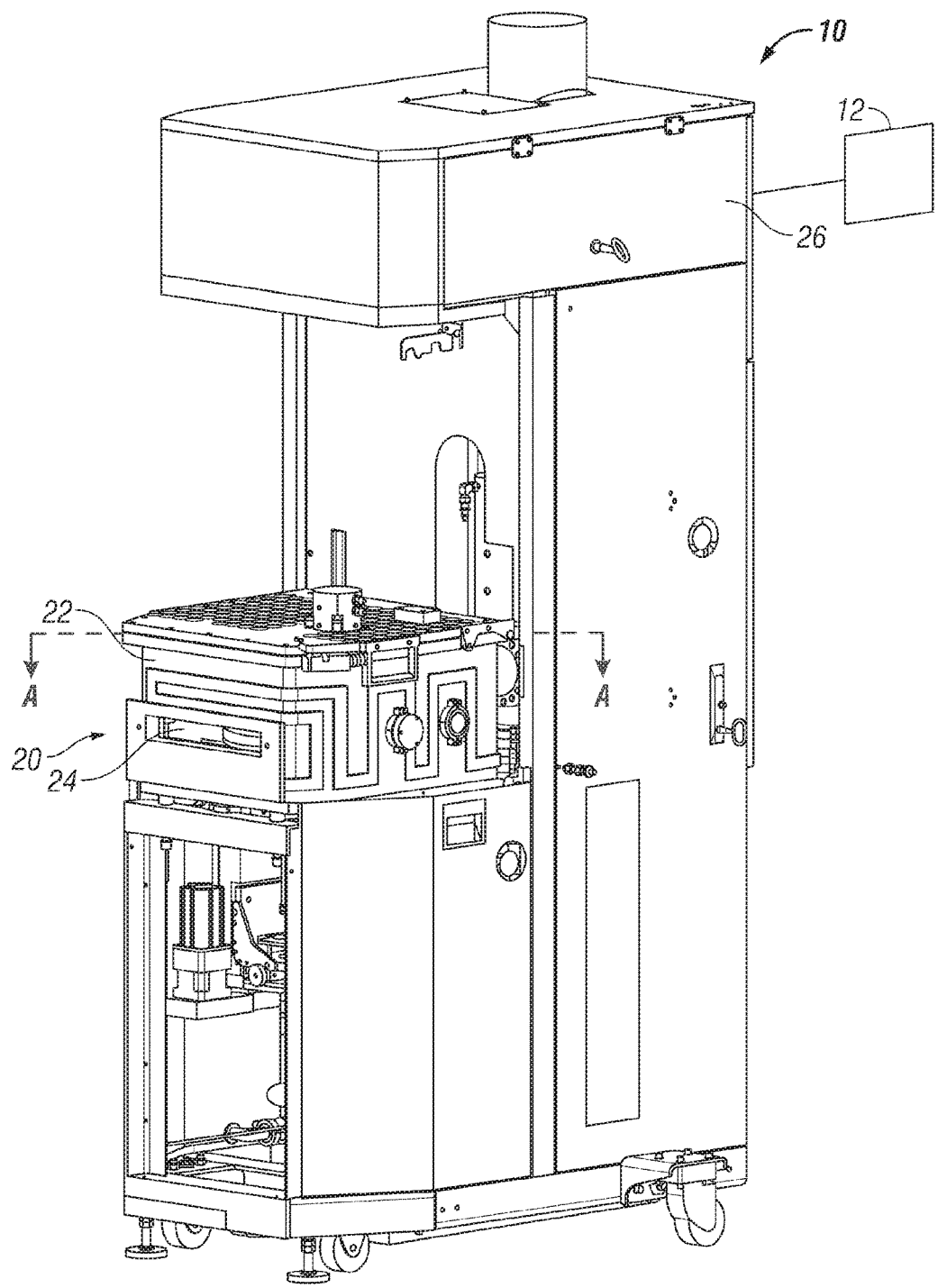
FIG. 1 is a perspective view of an ALD tool, including an ALD device with a gas distribution system.

In an ALD device, the reactor and the gas lines leading to the reactor are typically contained within a vacuum chamber. In order to maintain the precursors/reactants in vapor or gaseous form, the reactor, as well as the gas lines leading to the reactor, should be maintained at an appropriate temperature and often are heated. If the temperatures in the lines or reaction chamber are too low, condensation may occur and corrupt the ALD process. If the temperatures in the lines or reaction chamber are too high, the gases may degrade or decompose, which will also corrupt the ALD process.

In some ALD processes, depending on the types of precursors/reactants being used, the gases are continuously maintained at temperatures ranging from 50° C. to 650° C. or more. Such high temperature requirements can limit the ability to use valves and filters in the gas lines in the vacuum chamber, particularly in the lines close to the reactor. Moving such components outside the ALD hot zone can result in long pulse response times because of the distance between the source valve (outside the vacuum chamber) and the reactor, greater risk of diffusion of a reactant from a long line into the reactor between pulses of that reactant, long times required to purge the reactor of the previous reactant because of the lengths of gas lines between the source valve and the reactor, and increased potential for condensation of the precursor or reactant while it travels between the source valve and the reactor due to variations in temperature in longer gas lines.

In embodiments described herein, valves and/or filters to control the flow of precursors, reactants, and/or purge gases are provided close to the reactor (for example, close to the inlet of the reaction chamber), so as to provide improved pulse response time, a faster reactor purge, reduced precursor consumption, and reduced potential for condensation of source material, and to allow for shorter delivery and/or backsuction lines. In some embodiments, the valves and/or filters are mounted over the reactor itself. In some embodiments, the placement of valves and/or filters within a vacuum chamber surrounding the reaction chamber can reduce the space required to package such control hardware outside of the vacuum chamber, and can therefore reduce the space occupied by the overall ALD device. In some embodiments, placement of the valves near the reactor (e.g., mounted over the reactor or within a common vacuum chamber), may obviate separate valve heaters, as reaction chamber heaters can sufficiently heat the valves to prevent condensation. In some embodiments, the provision of filters within the vacuum chamber, downstream of any valves, can reduce the potential for particulate contamination on the substrate.

Atomic Layer Deposition (ALD)

Among vapor deposition techniques, ALD has the advantage of providing high conformality at low temperatures. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

Examples of suitable reactors that may be used include commercially available ALD equipment such as the Pulsar® reactor, available from ASM America, Inc. of Phoenix, Ariz. Many other kinds of reactors capable of ALD growth of thin films can be employed, including CVD reactors equipped with appropriate equipment and means for pulsing the precursors. In some embodiments a flow type ALD reactor is used.

The ALD processes described below can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run. A stand-alone reactor can be equipped with a load-lock. In that case, it is not necessary to cool down the reaction space between each run.

FIG. 1 illustrates an ALD apparatus or tool 10 in which embodiments of the invention may be used. The illustrated ALD tool comprises a cabinet 26 and an ALD device 20. The cabinet 26 may include a single cabinet or may include multiple cabinets coupled or connected together. The cabinet 26 may be any shape or size desirable. A controller or control system 12 for controlling the ALD apparatus 10 can be included inside or outside of the cabinet 26. The control system 12 can be any type of electrical system, processor, or the like which can be used to control the ALD process. In some embodiments, the control system 12 includes an input device that allows a user of the ALD tool 10 to input information to cause the ALD tool 10 to perform various ALD processes, for example with different types of precursors and reactant gases, at different temperatures, different pulse durations and/or for a different number of cycles. The ALD device 20 also includes a housing 22 in which a reactor 24 is disposed.

Figure 2:
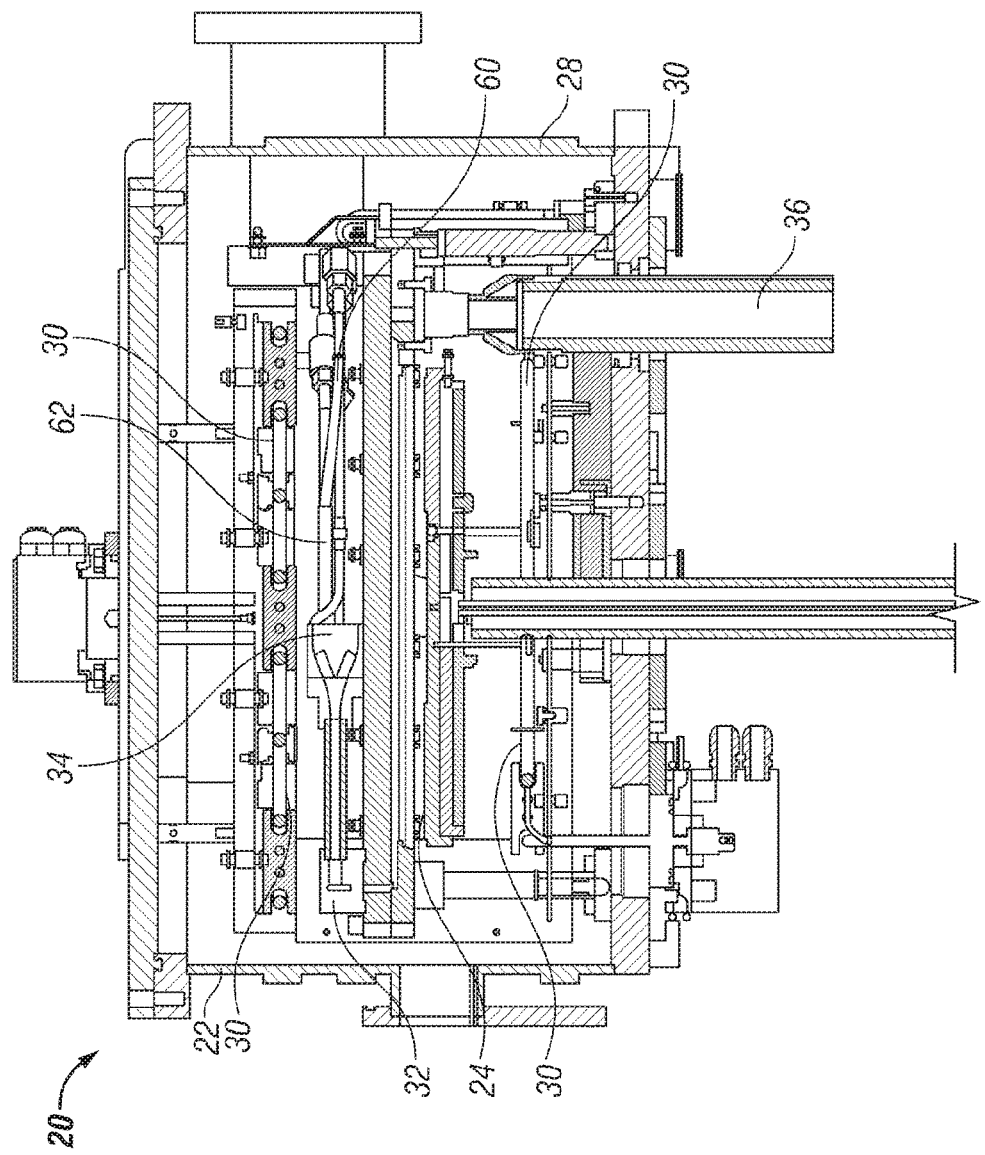
FIG. 2 is a cross-sectional view of the ALD device shown in FIG. 1, taken along line A-A of FIG. 1.

FIG. 2 is a cross-sectional view of the ALD device 20 shown in FIG. 1, taken along line A-A of FIG. 1. As shown in FIG. 2, the housing 22 surrounds or defines a vacuum chamber 28, inside which the reactor 24 is disposed. The housing 22 may be shaped in any way desired, and can be configured to contain devices for performing the ALD process, as well as contain the heat from the ALD process. For the purposes of the examples illustrated in this application, the housing 22 can include a rectangular box comprising a top, bottom and four sides. The top, bottom and four sides of the housing 22 may include various openings in order to allow gas lines and/or other apparatuses entry or exit from the housing. The vacuum chamber 28 can be an airtight container which is separate from the housing 22, or can be an airtight enclosure formed by portions of the housing 22. The housing 22 can also be configured to withstand ALD process temperatures, which can range from about 50° C. to 650° C. or higher. In some embodiments, the housing 22 may have cooled walls and/or insulation to keep the temperature of at least the exterior of the housing 22 significantly below the temperature of the ALD process occurring within. Such a configuration can help prevent burns to operators and can also extend the life of attached systems, such as a control system, by keeping these systems at a lower temperature.

The ALD device 20 can include one or more heaters 30 configured to heat the interior of the housing 22 and any gas lines and other structures which may be disposed within the housing 22. The heaters 30 may be disposed at the top and/or the bottom of the housing 22 in such a manner as to maintain as constant a temperature as possible throughout the housing 22. The heaters 30 may be any type of heater that can operate at high temperatures suitable for ALD processes, including without limitation coiled resistance heaters and radiant heaters.

As shown in FIG. 2, a gas distribution system 60 is disposed within the vacuum chamber 28 and connected to a mixer 34. In the mixer 34, gases received from the gas distribution system 60 are mixed before traveling through a diffuser or plenum 32 to the reactor 24. For example, during ALD, it may be desirable to mix one reactant with an inert carrier gas flow. Although ALD reactants are not mixed in the gas phase, the fact that two ALD reactants sequentially flow through the same space in the mixer means than second reactants can react with first reactants which may have adhered on the internal surfaces of the mixer from the previous reactant pulse, causing deposition. Such controllable deposition, upstream of the reaction chamber, is preferred as a sacrificial reaction, as compared to allowing the first reactant to desorb from the reaction chamber surfaces during the second reactant pulse, which can lead to uncontrolled, non-self-limiting CVD-like reactions in the chamber, which can build much more quickly than ALD-like reactions. The mixer 34 can then be periodically cleaned. Preferably, the mixer 34 has a smooth interior with no or very few and/or small discontinuities. In one preferred embodiment, the mixing device comprises a conical chamber in which the reactants enter at an angle with respect to the longitudinal axis of the chamber, causing the reactants to swirl around the inner conical surfaces and funnel to the reaction inlet channel 35. An example of such a mixer 34 for ALD is described, e.g., in US Patent Publication No. 2005-0092247 A1.

The diffuser 32 can be configured to spread the gases horizontally and lead the gases downward into the reactor 24. In particular, the inlet of the diffuser receives gases from the gas distribution system and delivers a broadened flow to an inlet flange of the reaction chamber below for horizontal, laminar flow through the reaction chamber. The diffuser 32 may be any shape that spreads the gases outward in a horizontal direction. As also illustrated in FIG. 2, a vacuum line 36 can be connected to the reactor 24 to continually exhaust the reactor of flowing gases and/or to evacuate periodically between pulses.

Although not illustrated in FIG. 2, the gases used in the ALD process (i.e., precursor/reactant gases and carrier/purge gases) are supplied to the gas distribution system 60 from a gas supply system outside of the housing 22. The precursor/reactant gases may be liquid, gas or solid at room temperature. Some gases used for ALD are naturally gaseous, while other reactants suitable for ALD processing are often liquid or solid at room temperature and atmospheric pressure and so are vaporized for processing. Conversion of each precursor/reactant into a gas can be performed outside of the housing 22 in a vaporizer vessel (not shown). The precursor/reactant gases can be mixed with a carrier gas, which may be an inert gas such as nitrogen or argon, before entering the gas distribution system 60. A single ALD apparatus may have multiple sources of precursor, reactant and/or carrier gases, each of which may have its own gas line in the gas distribution system 60. In some cases, a first line of carrier gas can enter the vaporizer vessel in order to carry the precursor gas, while a second line (which may also be referred to as a bypass line) enters the housing 22 for use in other aspects of the ALD process (e.g., use as a purge gas).

Figure 3:
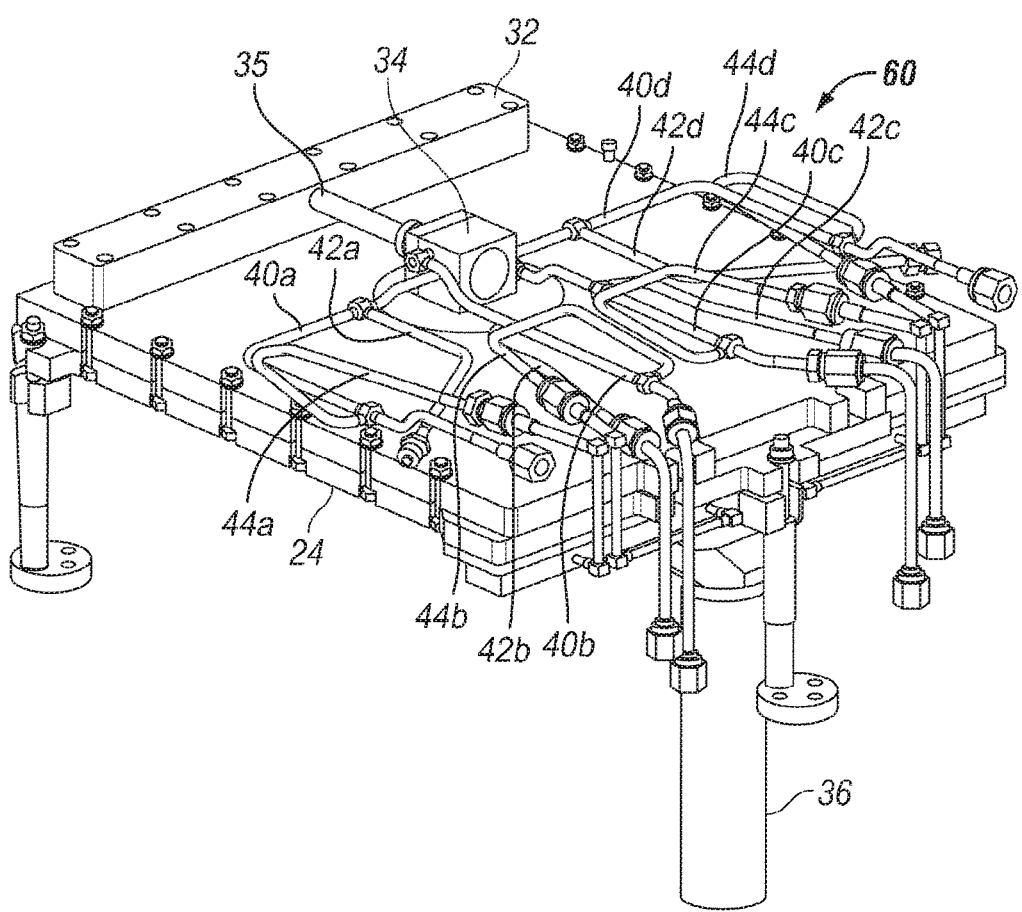
FIG. 3 is a perspective view of an ALD reactor, showing a gas distribution system.

As illustrated in FIG. 3, the gas distribution system 60 includes an inert gas valving (IGV) arrangement, by which the flow or diffusion of each precursor/reactant from its source vessel to the reactor 24 through reactant conduits 40a-d can be prevented by forming a gas phase barrier (also referred to as a diffusion barrier) of a gas (e.g., an inert gas) flowing in the opposite direction to the reactant flow in the conduit. Connected to each reactant conduit 40a-d, upstream of the mixer 34, is an inert gas conduit 42a-d, through which an inert gas may be fed into its corresponding reactant conduit 40a-d. Also connected to each reactant conduit 40a-d, upstream (relative to the reactant flow) of the connections to the inert gas conduits 42a-d, is a backsuction conduit 44a-d, each typically including a restrictor to prevent loss of reactant during reactant pulses. Backsuction may be applied through the backsuction conduit 44a-d to create a reverse flow of inert gas through the section of its corresponding reactant conduit 40a-d between the connections to the backsuction and inert gas conduits, and that reverse flow of inert gas serves as a diffusion barrier against continued reactant flow along the reactant conduit 40a-d. When a particular reactant gas pulse is to be stopped, the diffusion barriers (i.e., the portions of the reactant conduits 40a-d between the connection points for the inert gas conduits 42a-d and the backsuction conduits 44a-d) are positioned within the vacuum chamber 28, while the valves for creating the diffusion barriers (i.e., the valves for controlling the inert gas and reactant gas flow, not illustrated in FIG. 3) are disposed remotely, e.g., outside of the vacuum chamber 28. These valves can also be used for separating the gas spaces of the precursor/reactant source vessels and the reactor 24 during evacuation of either or both of these components. Often these remote valves employ separate heaters to avoid reactant condensation, as they may be too remote from the reactor heaters 30 (FIG. 2).

In the distribution system 60 illustrated in FIG. 3, the precursor/reactant, and carrier/purge gases must travel through long gas lines between their respective control valves (outside the vacuum chamber 28) and the mixer 34. Such an inert gas valving (IGV) arrangement has traditionally been employed in order to provide the diffusion barrier to shut off the flow close to the chamber, while at the same time employing valves remote from the reaction chamber, outside the hot zone and thus not subject to the degradation of a high heat environment. However, these long gas lines can allow for variations in temperature and can also result in precipitate or decomposition of the gases, which can compromise the ALD process. Moreover, a lot of precursor is trapped in those long lines with relatively high pressure, which the diffusion barrier is to stop. Long lines additionally effectively slow pulsing. At the beginning of a reactant pulse, the inert gas flow along the inert gas conduit 42a-d is to be reduced to turn off the backward flow (diffusion barrier) and allow forward flow of reactant through the corresponding reactant conduit 40a-d. A long inert gas line from the remote valves to the diffusion barrier, however, delays the time it takes for reduced inert gas flow to be effective and start the reactant pulse.

Figure 4:
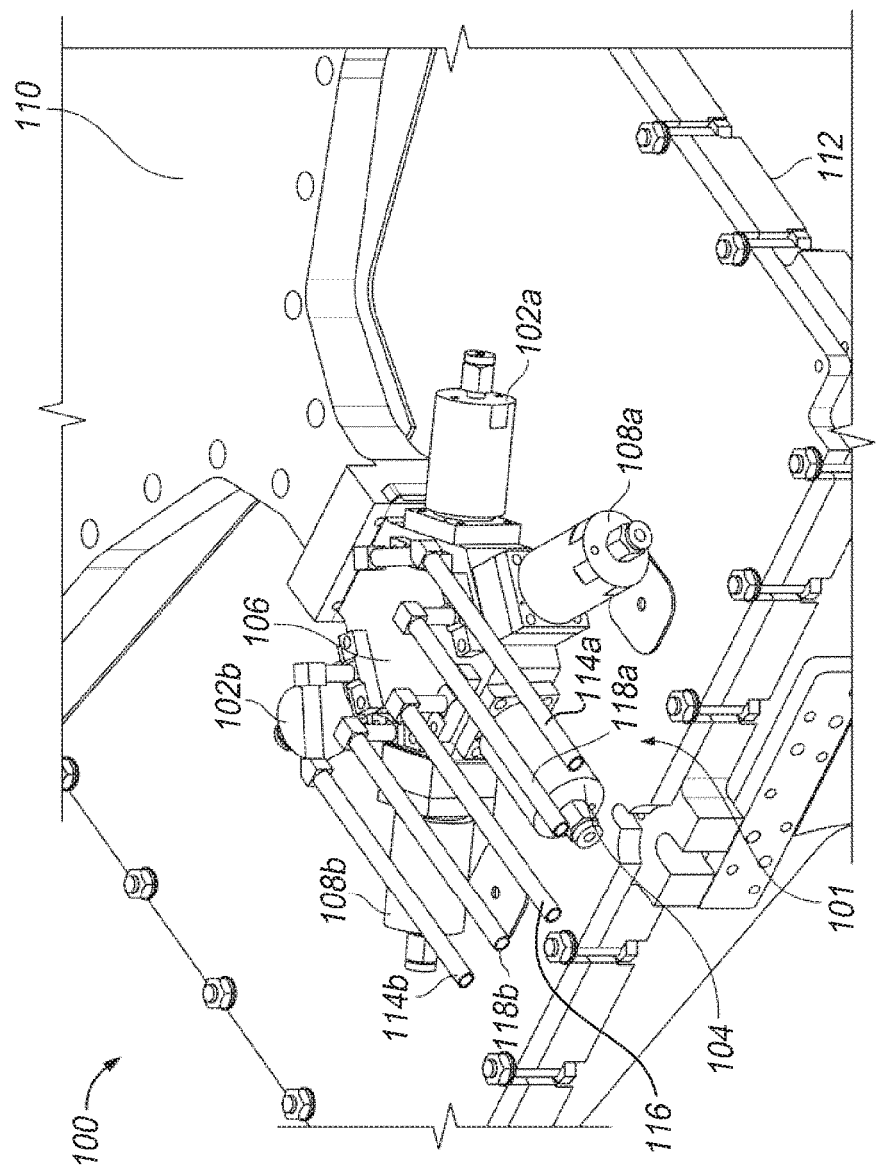
FIG. 4 is a perspective view of a portion of an ALD device, including a gas distribution system configured according to an embodiment.

FIG. 4 illustrates an ALD device 100 including a gas distribution system 101 configured according to an embodiment of the present invention. The gas distribution system 101 of FIG. 4 can be disposed relatively close to a downstream reactor 112, such that a distance between control valve seats and the point at which different reactant flow paths merge to form a common flow path (e.g., to a common bore in a mixer, or to a diffuser) is in a range of about 5 mm to 150 mm, more preferably within about 10 mm to 100 mm, as measured along the gas flow paths. The positioning of the gas distribution system can also be such that the valves and reactor 112 share a common heating system, such as the reactor heaters 30 of FIG. 2, without separate heaters or heater controls for the valves. For example, the gas distribution system 101, including valves, can be positioned along with the reactor 112 within a heated vacuum chamber inside the ALD device 100, which may be configured in a similar manner to the ALD device illustrated in FIG. 2.

As shown in FIG. 4, the gas distribution system 101 includes two precursor/reactant gas valves 102a and 102b and an inert gas valve 104 mounted on a common manifold 106. Each of the precursor/reactant valves 102a and 102b is configured to control a supply of a precursor (or reactant) gas to the manifold 106. The inert gas valve 104 is configured to control a supply of an inert gas (e.g., carrier or purge gas) to the manifold 106. Also mounted on the manifold 106 are two backsuction valves 108a and 108b, which are configured to control the application of suction to the manifold 106. The manifold 106 feeds into a diffuser 110, which, in turn, feeds into a reactor 112. In the illustrated example, the reactor 112 is a horizontal flow reactor, such that the diffuser 110 feeds an inlet flange at the side of the reaction space within the reactor 112 to produce a laminar, horizontal flow of gases parallel and across the upper surface of the substrate. As can be seen in FIG. 4, the gas distribution system 101, including the valves 102a, 102b, 104, 108a, and 108b, is mounted on or disposed directly above the reactor 112, such that the distances are short and the gas distribution system 101 can be efficiently heated. In the illustrated embodiment, the manifold 106 is mounted to the diffuser 110 that leads directly into the reactor 112. The manifold 106 can also be mounted directly onto the reactor 112.

The precursor/reactant valves 102a and 102b are connected via supply lines 114a and 114b, respectively, to precursor or reactant sources (not shown), which can be disposed outside the ALD device 100. The inert gas valve 104 is connected via a supply line 116 to an inert gas source (not shown), which can also be disposed outside the ALD device 100. The backsuction valves 108a and 108b are connected via lines 118a and 118b, respectively, to one or more vacuum sources (not shown), which can also be disposed outside the ALD device 100. The lines 114a, 114b, 116, 118a, and 118b may comprise any type of piping or tubing that can withstand the temperatures to which they will be heated inside the vacuum chamber. The lines 114a, 114b, 116, 118a, and 118b can also be formed of a material which will not react with the gases flowing through them.

In embodiments, the valves 102a, 102b, 104, 108a, and 108b can be configured to operate at very high speeds, with open/close times in the microsecond range, e.g., 5-100 ms, preferably 5-10 ms. To allow for their use inside the heated vacuum chamber in such close proximity to the reactor 112, the valves 102a, 102b, 104, 108a, and 108b can also be configured to operate at temperatures up to 220° C. or higher.

While illustrated with two each, the number of precursor/reactant valves 102a, 102b, inert gas valves 104, and backsuction valves 108a, 108b can vary in embodiments, depending on the particular application and the desired processing capability of the ALD system. Typically an ALD system includes at least two reactants and gas distribution therefor, and three- and four-reactant systems are not uncommon. The valves 102a, 102b, 104, 108a, and 108b may be any type of valve that can withstand high temperatures. Valves 102a, 102b, 104, 108a, and 108b may be ball valves, butterfly valves, check valves, gate valves, piezoelectric valves, globe valves or the like. Metal diaphragm valves may also be used, and may be preferred for a high temperature environment. In some embodiments, the valves 102a, 102b, 104, 108a, and 108b can be pneumatically actuated valves. The valves 102a, 102b, 104, 108a, and 108b may be formed from any material that will function at the high temperatures required for ALD processing, such as 316L stainless steel and the like. Some embodiments, such as an ALD system configured for alumina deposition, can include valves configured to operate up to 220° C. Still other embodiments can include valves configured to operate at temperatures up to 400° C., or at even higher temperatures. Of note, the reactant and backsuction valves in each of the embodiments described herein need not be leak tight when "closed" due to the operation of IGV. Rather, the reaction and backsuction valves may be leaky or non-fully closing, as disclosed in U.S. Patent Publication No. 2010-0266765 A1, published on Oct. 21, 2010, the entire disclosure of which is incorporated herein by reference. Because the valves need not fully close in the offstate, while inert gas valving still cleanly cuts off reactant flow between reactant pulses by way of a diffusion barrier, degradation of the valves within the hot zone is of less concern. At the same, reactant losses can be reduced by controlling relative flow through the backsuction lines at different points in the process, relative to fixed restrictors on the backsuction lines as more commonly used for IGV. Alternatively, the valves may be fully closing.

As shown in FIG. 4, the valves 102a, 102b, 104, 108a, and 108b can be surface-mount valves. In some embodiments, fixed orifices can also be disposed between the backsuction valves 108a and 108b, respectively, and the manifold 106, as shown and discussed below with respect to FIG. 5B. The provision of fixed orifices can be useful in controlling backsuction of residual precursors or reactants to the vacuum source.

In some embodiments, the manifold 106 can include a mixer for mixing, e.g., a reactant flow from one source (e.g., including reactant and inert carrier gases) with inert gas flow from another source during operation. For example, in one embodiment, the manifold 106 includes a conical chamber, with gases (e.g., precursor/reactant gases and carrier/purge gases) entering at an angle with respect to the longitudinal axis of the chamber, causing the gases to swirl around the inner conical surfaces and funnel to the diffuser 106.

Figure 5:
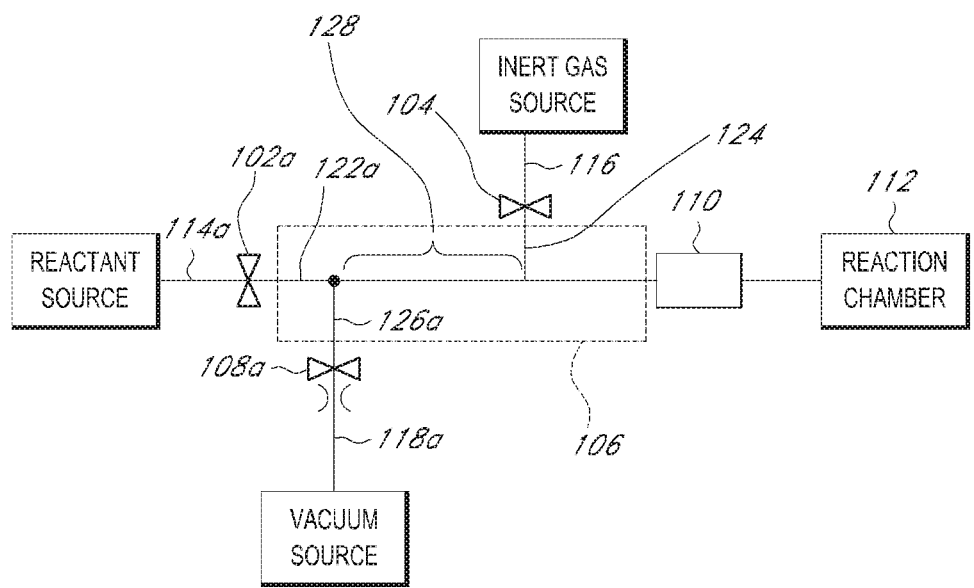
FIG. 5 is a schematic illustration of a gas distribution system, applicable to the device illustrated in FIG. 4, showing connections among the paths for inert gas valving (IGV) functionality.

FIG. 5 is a schematic illustration of one manner of configuring the gas distribution system 101 illustrated in FIG. 4 for inert gas valving (IGV). FIG. 5 shows the flow paths for only one reactant; the skilled artisan will readily appreciate that a similar structure is provided for each additional reactant (two total shown in FIG. 4, but additional reactants can be added).

As shown in FIG. 5, the precursor/reactant valve 102a, inert gas valve 104, and the backsuction valve 108a are in fluid communication with the interior of the manifold 106 via short passageways 122a, 124, and 126a, respectively, which passageways can extend through the body of the manifold 106 to reach a central bore. FIG. 5 shows the position of a gas diffusion barrier 128 within the manifold 106. As described below, the gas diffusion barrier 128 forms between pulses of the reactant.

In operation, a first precursor/reactant gas valve 102a can be opened to allow the gas to travel through its corresponding line 122a and into the manifold 106. The precursor/reactant gas (or precursor/reactant and carrier gas mixture) then travels through the diffuser 110 and into the reactor 112. Once a sufficient amount of precursor/reactant gas (which may be determined by the ALD recipe as sufficient to saturate the substrate surface within the reactor 112) has been allowed into the reactor 112, the valve 102a can be closed to restrict the flow of the precursor/reactant gas. Approximately simultaneously, the backsuction valve 108a can be opened to apply backsuction to the manifold 106 through the line 126a and thereby cause a backward flow along the reactant path from the inert gas source to the junction with the backsuction line, as illustrated by the diffusion barrier 128 in FIG. 5. In some embodiments, the inert gas valve 104 can be open throughout the entire cycle, to allow the inert gas into the manifold 106 to act as a carrier gas for each precursor or reactant gas during precursor/reactant pulses, as well as a purge gas between precursor/reactant pulses. This cycle can be then repeated with the second precursor/reactant gas valve 102b and backsuction valve 108b (FIG. 4). The entire process can be repeated in order to build up a layer of a desired thickness on the substrate in the reactor.

In some embodiments of FIG. 4, backsuction valves 108a, 108b and IGV functionality may not be included, and instead longer periods of purging with inert gas can be used to control a purge cycle in which the inert gas is used to force any non-reacted gases and any gaseous reaction byproducts through and out of the reactor.

Locating such valves 102a, 102b, 104, 108a, and 108b within the vacuum chamber and/or mounted close to the inlet of the reactor 112 (e.g., 5-150 mm or 10-100 mm between valve seats and the point at which the different reactant flow paths merge to form a common flow path into the chamber) can eliminate the need to separately heat the valves farther upstream of the reactor 112, or outside the vacuum chamber, as heating of the reactor 112 may be sufficient to also heat the valves sufficiently to avoid condensation. In addition, embodiments can provide improved valve pulse response time, as well as the time required between cycles. Embodiments can also reduce the use (and waste) of precursor and reactant gases, at least in part due to the fact that there is a smaller volume of gas between the respective valves and the reactor. Even less waste can be achieved during reactant pulses by use of controlled valves, even if not gas tight, on the suction line rather than restrictors alone. Further, embodiments can reduce the delivery line surface area to which the precursor and reactant gases are exposed after leaving their respective valves, reducing the risk of decomposition or condensation in the delivery lines.

Figure 6:
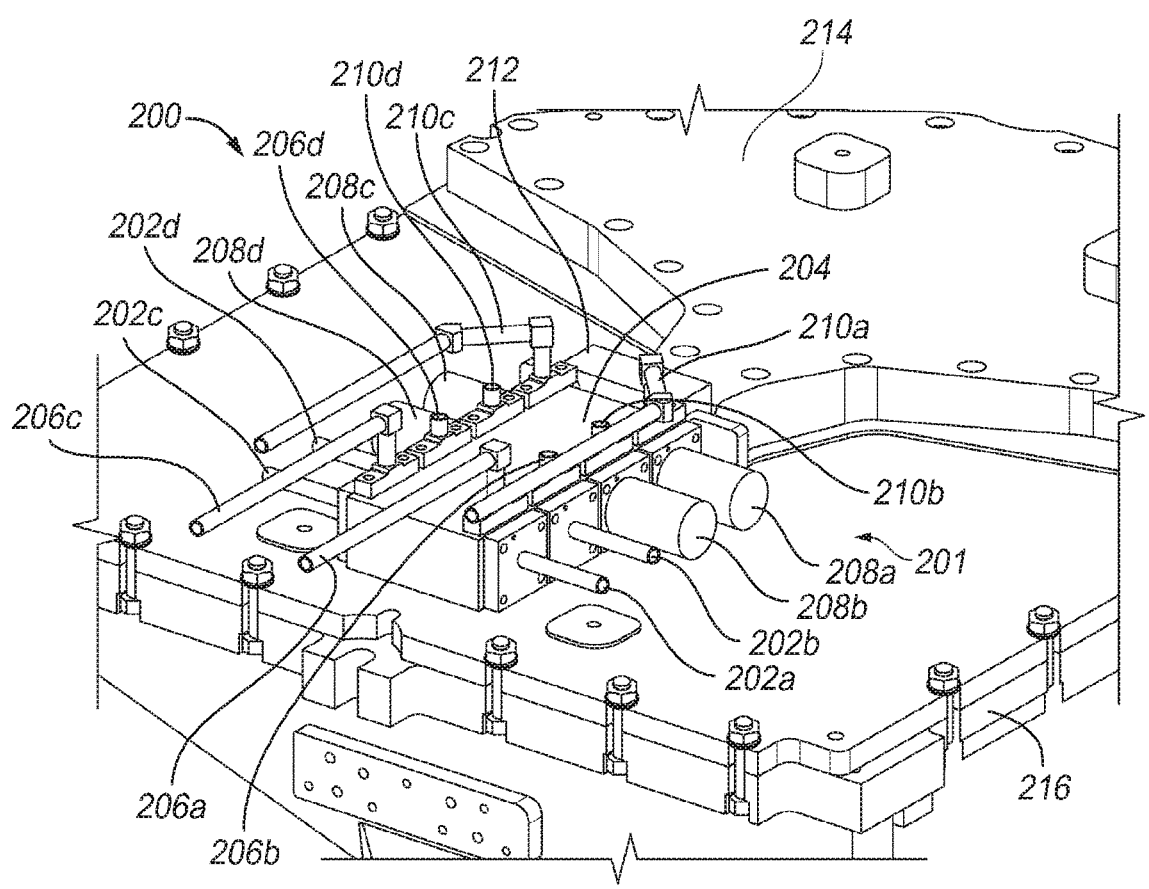
FIG. 6 is a perspective view of an ALD reactor having a gas distribution system configured according to another embodiment.
Figure 7:
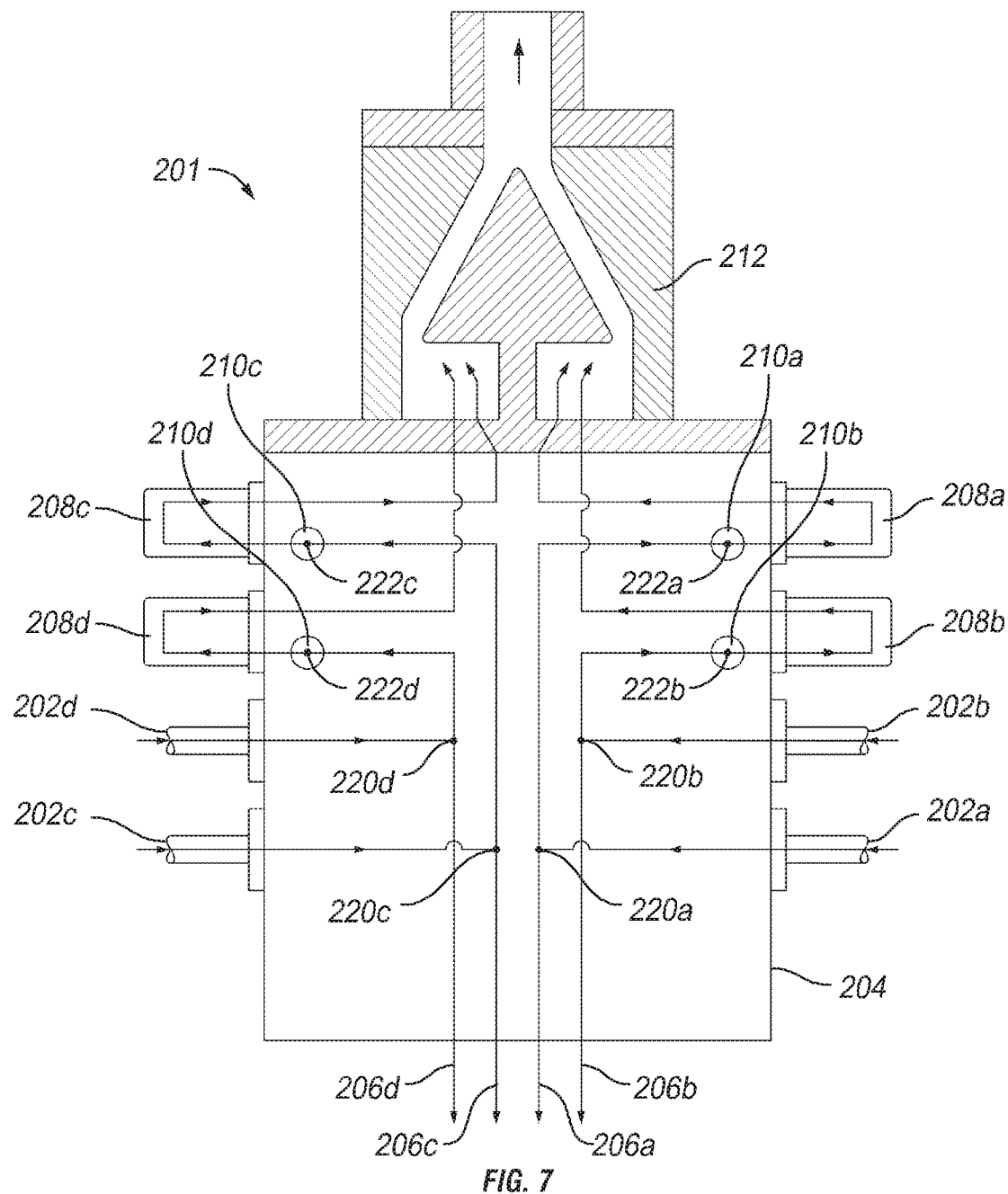
FIG. 7 is a schematic illustration of the gas distribution system illustrated in FIG. 6.

FIGS. 6 and 7 illustrate an ALD device 200 including a gas distribution system 201 configured according to another embodiment. The gas distribution system 201 of FIG. 6 can be disposed within a heated vacuum chamber inside the ALD device 200, which may be configured in a similar manner to the ALD device illustrated in FIG. 2. Alternatively, the gas distribution system 201 need not be within a vacuum chamber, but sits sufficiently close to a downstream ALD reactor 216 as to be heated by the reactor's heating system and avoid reactant condensation, without any separate heating system for the illustrated components of the gas distribution system 201. The gas distribution system 201 of FIG. 6 can be disposed relatively close to the downstream reactor 216, such that a distance between control valve seats and the point at which different reactant flow paths merge to form a common flow path (e.g., to a common bore in a mixer, or to a diffuser) is in a range of about 5 mm to 150 mm, more preferably within about 10 mm to 100 mm, as measured along the gas flow paths. The positioning of the gas distribution system can also be such that the valves and reactor 216 share a common heating system, such as the reactor heaters 30 of FIG. 2, without separate heaters or heater controls for the valves.

As shown in FIG. 6, the gas distribution system 201 includes four precursor/reactant gas lines 202a-d connected to a common manifold 204. Each precursor/reactant gas line 202a-d has a corresponding backsuction line 206a-d which is also connected to the common manifold 204. In addition, each precursor/reactant gas line 202a-d has a corresponding filter 208a-d which is mounted on the common manifold 204. Each precursor/reactant gas line 202a-d also has a corresponding inert gas line 210a-d, each of which connects with its corresponding precursor/reactant gas line 202a-d, upstream of its corresponding filter 208a-d and downstream of its connection to its corresponding backsuction line 206a-d. "Downstream" and "upstream," as used here, assume flow toward the reactor 216 for purpose of establishing directions. The interior of the manifold 204 leads to a mixer 212, which funnels gases into a diffuser 214. As can be seen in FIG. 6, the manifold 204, along with the precursor/reactant gas lines 202a-d, the backsuction lines 206a-d, the filters 208a-d, and the inert gas lines 210a-d are all connected to the manifold 204 in close proximity to (and, in this embodiment, mounted to and directly above) the reactor 216. In the illustrated embodiment, the manifold 204 is mounted by way of the mixer 212 to the diffuser 214 that leads directly into the reactor 216. The manifold 204 can also be mounted directly onto the reactor 216.

Outside of the ALD device 200, the precursor/reactant gas lines 202a-d are connected to precursor or reactant sources (not shown). The inert gas lines 210a-d are connected to an inert gas source (not shown), which can also be disposed outside the ALD device 200. The backsuction lines 206a-d are connected to one or more vacuum sources (not shown), which can also be disposed outside the ALD device 200. One or more valves (not shown) can be disposed outside the ALD device 200 and configured to control the supply of precursor/reactant or inert gas to the precursor/reactant gas lines 202a-d and the inert gas lines 210a-d, respectively. One or more additional valves (not shown) can be disposed outside the ALD device 200 and configured to control the application of suction on the backsuction lines 206a-d. The lines 202a-d, 206a-d, and 210a-d may comprise any type of piping or tubing that can withstand the temperatures to which they will be heated inside the vacuum chamber or otherwise commonly heated with the reactor 216. The lines 202a-d, 206a-d, and 210a-d can also be formed of a material which will not react with the gases flowing through them. The number of precursor/reactant lines 202a-d, inert gas lines 210a-d, backsuction lines 206a-d, and filters 208a-d can vary in embodiments, depending on the particular application and the desired processing capability of the ALD system.

The filters 208a-d can be configured to prevent particles from traveling from the upstream gas lines 202a-d and 210a-d into the reactor 216. The manifold 204, as well as the filters 208a-d attached to the manifold 204, can be heated to a temperature close or equal to the temperature of the reactor 216 so as to limit or prevent condensation of vapors, at least within or downstream of the filters 208a-d. In embodiments, the filters 208a-d can be any type of filter that can withstand high temperatures, such as, for example, high purity porous metal (e.g., sintered metal) media or porous ceramic filters.

As shown in FIG. 6, the filters 208a-d can be surface-mount filters which are positioned on the manifold 204 in very close proximity to point of entry of the reactant/precursors to the mixer 212. The use of surface-mount filters can enable a much smaller, more compact arrangement of gas or vapor delivery components as compared to conventional systems, allowing their placement within the heated vacuum chamber or hot zone in which the reactor 216 is disposed. Positioning the filters 208a-d within the heated vacuum chamber can make the performance of the ALD device 200 less sensitive to temperature variations within the gas lines and can also obviate separate heaters for the filters, as the heaters for the reactor 216 and/or outer vacuum chamber can sufficiently heat the filters. By locating the filters 208a-d very close to the inlet of the reactor 216, very little particle contribution would be expected from upstream components (such as, for example, the lines 202a-d and 210a-d and associated valves).

FIG. 7 is a schematic illustration of the gas distribution system 201 illustrated in FIG. 6. As shown in FIG. 7, the backsuction lines 206a-d are in fluid communication with corresponding precursor/reactant gas lines 202a-d at points 220a-d within the manifold 204, upstream of points 222a-d where the inert gas lines 210a-d join with the precursor/reactant gas lines 202a-d. The filters 208a-d are located downstream, relative to the direction of reactant flow, of the points 222a-d.

In operation, a first precursor/reactant gas valve (not shown) can be opened to allow the gas to travel through its corresponding line 202a and into the manifold 204. In some embodiments, an inert gas valve (not shown) can be opened at the same time or kept open to allow the inert gas into the manifold 204 through inert gas line 210a, to act as a carrier gas for the precursor or reactant gas or to prevent contamination of the inert gas line 201a with stagnant precursor. The precursor/reactant gas (or precursor/reactant and carrier gas mixture) then travels through the filter 202a, into the mixer 212, and then into the reactor 216 (FIG. 6). Once a sufficient amount of precursor/reactant gas (which according to typical ALD recipes is sufficient to saturate the substrate surface within the reactor 216) has been allowed into the reactor 216, the precursor/reactant gas valve controlling line 202a can be closed to restrict the flow of the precursor/reactant gas. Next, inert gas flow is increased or reestablished through line 210a, backsuction is applied to line 206a to create a reverse flow of gas between the connection points 222a and 220a, thereby creating a diffusion barrier and preventing any reactant from diffusing forward (i.e., from line 202a toward the manifold 204). Additional inert gas that is not drawn into the backsuction line can purge the reactor 216 of any remaining precursor/reactant gas (and/or byproduct). This cycle can be then repeated with second, third, and fourth precursor/reactant gases in lines 202b-d, respectively, and their corresponding inert gas lines 210b-d and backsuction lines 206b-d. The entire process can be repeated as desired in order to build up a layer of a desired thickness on the substrate in the reactor 216.

In some embodiments, backsuction lines 206a-d may not be included, and instead the inert gas lines 210a-d can be used to control purge cycles in which the inert gas is used to force any non-reacted gases and any gaseous reaction byproducts through and out of the reactor 216, without creating a diffusion barrier.

Figure 8:
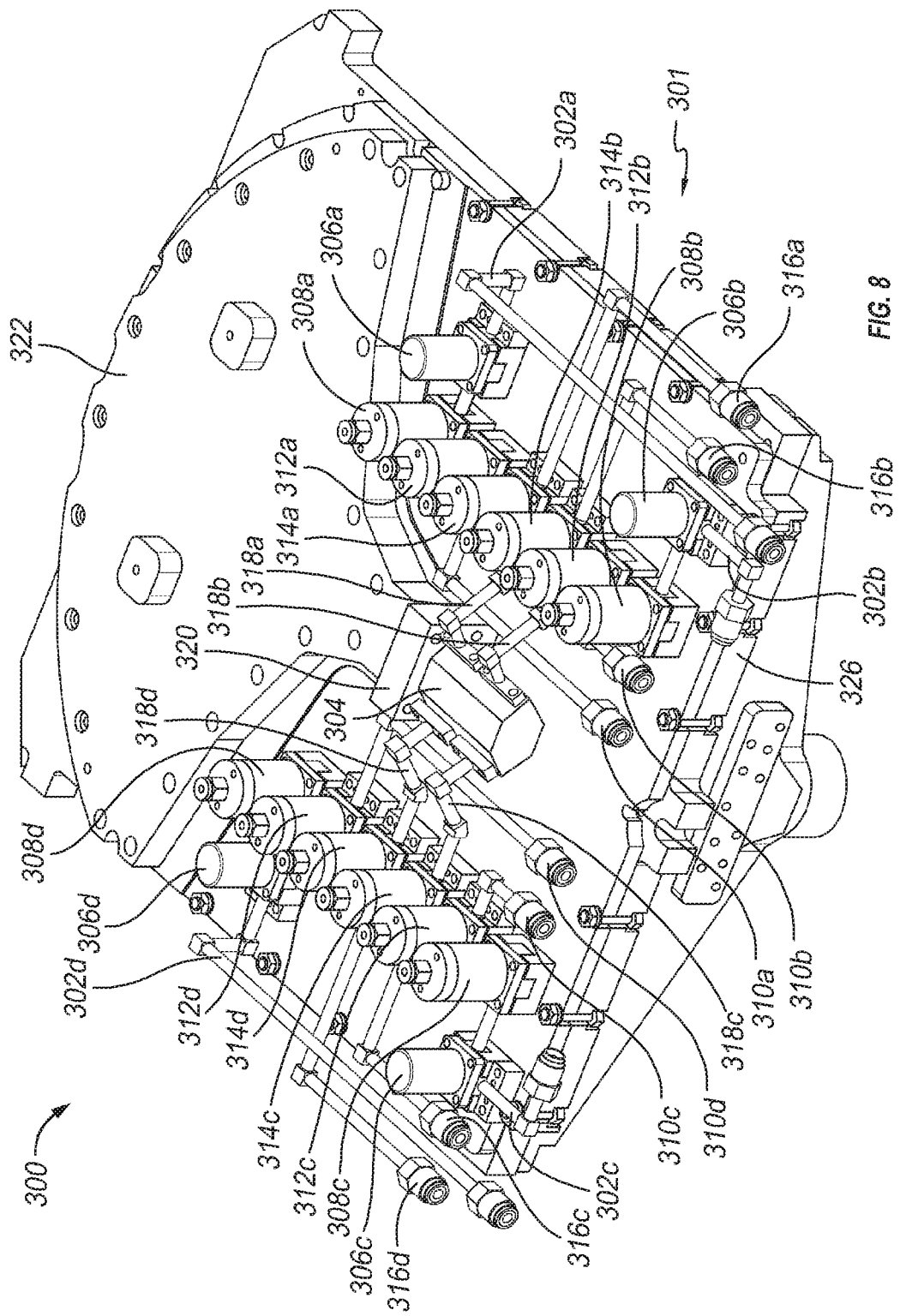
FIG. 8 is a perspective view of an ALD reactor having a gas distribution system configured according to a further embodiment.

FIG. 8 illustrates an ALD device 300 including a gas distribution system 301 configured according to still another embodiment. The gas distribution system 301 of FIG. 8 can be disposed within a heated vacuum chamber (not shown) inside the ALD device 300, which may be configured in a similar manner to the ALD device illustrated in FIG. 2. Alternatively, the gas distribution system 301 need not be within a vacuum chamber, but sits sufficiently close to a downstream ALD reactor 326 as to be heated by the reactor's heating system and avoid reactant condensation, without any separate heating system for the illustrated components of the gas distribution system 301. The gas distribution system 301 of FIG. 8 can be disposed relatively close to the downstream reactor 326, such that a distance between control valve seats and the point at which different reactant flow paths merge to form a common flow path (e.g., to a common bore in a mixer, or to a diffuser) is in a range of about 5 mm to 150 mm, more preferably within about 10 mm to 100 mm, as measured along the gas flow paths. The positioning of the gas distribution system can also be such that the valves and reactor 326 share a common heating system, such as the reactor heaters 30 of FIG. 2, without separate heaters or heater controls for the valves.

As shown in FIG. 8, the gas distribution system 301 includes four precursor/reactant gas lines 302a-d which are connected, through various other components, to a common manifold 304. Each precursor/reactant gas line 302a-d has a corresponding filter 306a-d through which the gas passes as it travels toward the manifold 304. Downstream of each filter 306a-d is a corresponding precursor/reactant gas valve 308a-d, which controls the flow of precursor/reactant gas from the filter 306a-d to a backsuction valve 312a-d. The precursor/reactant gas valves 308a-d can be two-port valves, with one port connected to an outlet of each filter 306a-d, and with the other port connected to a first port of the corresponding backsuction valve 312a-d. Downstream of each backsuction valve 312a-d is a corresponding inert gas valve 314a-d. The backsuction valves 312a-d can be three-port valves, with a second port connected to a first port of a corresponding inert gas valve 314a-d, and with a third port connected to a corresponding backsuction line 310a-d. The inert gas valves 314a-d can also be three-port valves, with a second port in fluid communication with the manifold 304, and with a third port connected to a corresponding inert gas supply line 316a-d. The inert gas valves 314a-d can connect with the manifold 304 through corresponding connecting lines 318a-d, as shown in FIG. 8, or they can be mounted directly on the manifold 304. In the illustrated embodiment, the manifold 304 is mounted by way of a mixer 320 to a diffuser 322 that leads directly into the reactor 325. The manifold 304 can also be mounted directly onto the reactor 326.

Outside of the ALD device 300, the precursor/reactant gas lines 302a-d are connected to precursor or reactant sources (not shown). The inert gas supply lines 316a-d are connected to one or more inert gas sources (not shown), which can also be disposed outside the ALD device 300. The backsuction lines 310a-d are connected to one or more vacuum sources (not shown), which can also be disposed outside the ALD device 300.

In operation, to effect a first pulse of a reactant or precursor gas, a first precursor/reactant gas valve 308a can be opened to allow the gas to travel from its corresponding line 302a, through the filter 306a, and through the backsuction valve 312a. The port of the backsuction valve 312a that is connected to the backsuction line 310a can be closed while the other two ports remain open, so that the precursor/reactant gas can pass through the valve 312a to the inert gas valve 314a. The three-port inert gas valve 314a can have at least two ports open, so as to allow the precursor/reactant gas to pass through the valve 314a, to the connecting line 318a and into the manifold 204. In some embodiments, the port of the inert gas valve 314a that is connected to the inert gas supply line 316a can be open at the same time, so as to allow inert gas to flow into the connecting line 318a along with the precursor/reactant gas. The precursor/reactant gas (or precursor/reactant and inert gas mixture) then travels through the manifold 304, into the mixer 320, and then into the diffuser 322 and thence into a reactor 326 upon which the gas distribution system 301 is mounted.

Once a sufficient amount of precursor/reactant gas (which according to typical ALD recipes is sufficient to saturate the substrate surface within the reactor 326) has been allowed into the reactor 326, the precursor/reactant gas valve 308a can be closed to restrict the flow of the precursor/reactant gas. Next, with the inert gas valve 314a open, the port of the backsuction valve 312a which is connected to the backsuction line 310a can be opened to create a reverse flow of gas, from the inert gas valve 314a toward the backsuction valve 312a, thereby creating a diffusion barrier and preventing any reactant from diffusing forward (i.e., toward the manifold 304). Additional inert gas that is not drawn into the backsuction line can purge the reactor 326 of any remaining precursor/reactant gas (and/or byproduct). This pulse sequence can be then repeated with second, third, and fourth precursor/reactant gas valves 306b-d for lines 302b-d, respectively, and their corresponding inert gas valves 312b-d and backsuction valves 314b-d, as called for by the ALD recipe for each cycle. As will be understood by the skilled artisan, an ALD recipe may employ two, three, four or more reactants or precursors per cycle, pulses of which are generally (but not necessarily) separated by a purging stage. The entire process can be repeated as desired in order to build up a layer of a desired thickness on the substrate in the reactor 326. The skilled artisan will also appreciate that not every cycle in a given ALD process is necessarily identical with all other cycles in the process, and changes may be made to tailor composition and profile of the thin film being deposited.

In some embodiments, one or more of the backsuction valves (such as backsuction valves 108a, 108b, and/or 312a-d) can be cycled between two levels of flow coefficients. For example, in a first state, a valve 312a-d can have a relatively higher flow coefficient, while in a second state, the valve 312a-d can have a relatively lower flow coefficient, comparable to the fixed restrictors used in inert gas valving arrangements. For example, the first state can be a fully open position, and the second state can be an almost closed position. The first state can be used to more rapidly stop a precursor/reactant pulse (by rapidly creating the diffusion barrier using a large backsuction flow enabled by the higher flow coefficient), while the second state can be used during precursor/reactant pulsing to reduce precursor/reactant waste through the backsuction lines (using a low backsuction flow enabled by the lower flow coefficient). Stated another way, using pulsed backsuction, the time to reverse flow in the diffusion barrier zone can be reduced compared to use of a fixed restrictor by increasing backsuction between precursor/reactant pulses (i.e., the inert gas valving turns on faster). Also, the chemical waste of precursor/reactant to process exhaust can be reduced during precursor/reactant pulsing since backsuction flow is very low.

In some embodiments, backsuction valves 314a-d may not be included, and instead the inert gas valves 312a-d can be used to control purge cycles in which the inert gas is used to force any non-reacted gases and any gaseous reaction byproducts through and out of the reactor 326, without inert gas valving.

Figure 9:
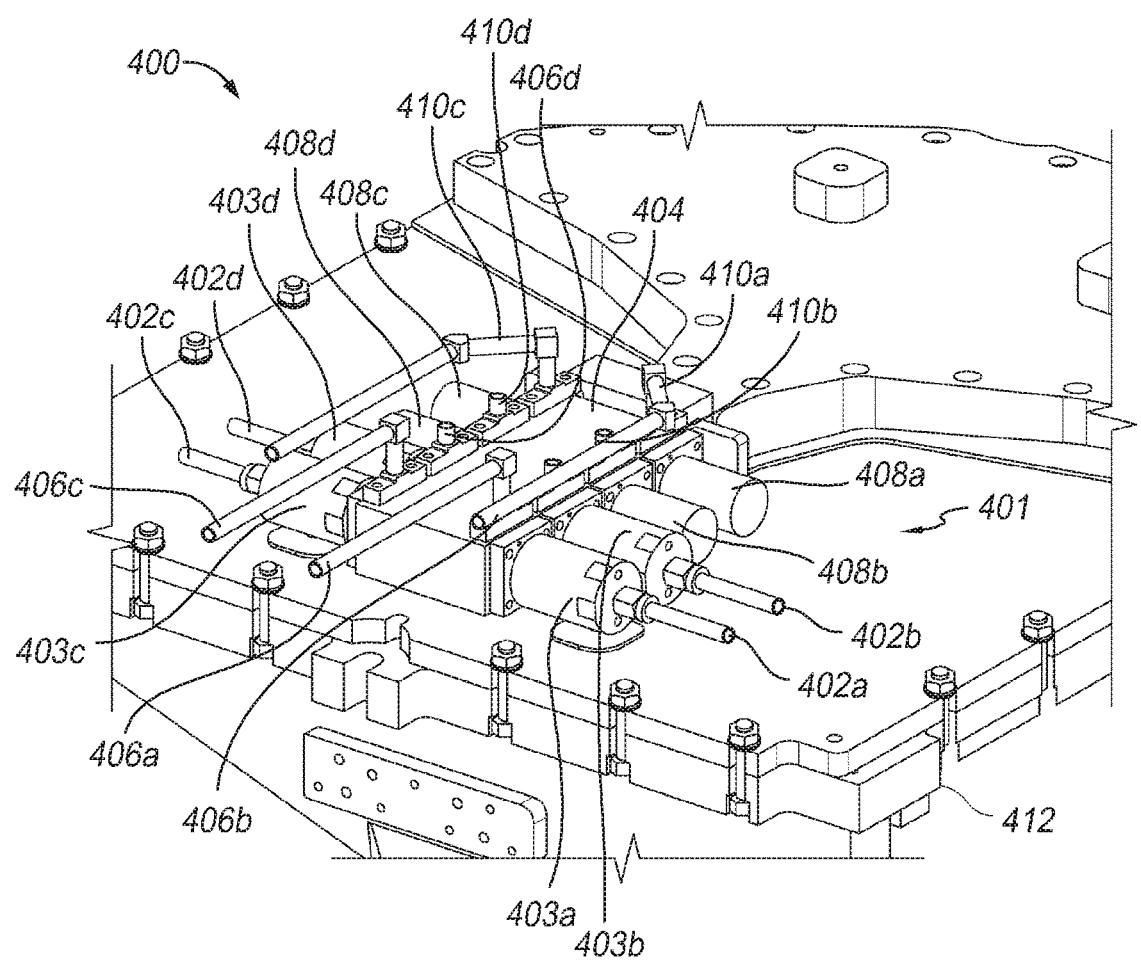
FIG. 9 is a perspective view of an ALD reactor having a gas distribution system configured according to a still further embodiment.

FIG. 9 illustrates an ALD device 400 including a gas distribution system 401 configured according to further embodiment. The gas distribution system 401 of FIG. 9 can be mounted on a reactor 412 and disposed within a heated vacuum chamber (not shown) inside the ALD device 400, which may be configured in a similar manner to the ALD device illustrated in FIG. 2. Alternatively, the gas distribution system 401 need not be within a vacuum chamber, but sits sufficiently close to the downstream ALD reactor 412 as to be heated by the reactor's heating system and avoid reactant condensation, without any separate heating system for the illustrated components of the gas distribution system 401. The gas distribution system 401 of FIG. 9 can be disposed relatively close to the downstream reactor 412, such that a distance between control valve seats and the point at which different reactant flow paths merge to form a common flow path (e.g., to a common bore in a mixer, or to a diffuser) is in a range of about 5 mm to 150 mm, more preferably within about 10 mm to 100 mm, as measured along the gas flow paths. The positioning of the gas distribution system can also be such that the valves and reactor 412 share a common heating system, such as the reactor heaters 30 of FIG. 2, without separate heaters or heater controls for the valves.

The gas distribution system 401 is configured in a similar manner to the gas distribution system 201 shown in FIG. 6, except that the system 401 includes four precursor/reactant gas valves 403a-d configured to control the flow of each precursor/reactant gas from its corresponding precursor/reactant gas line 402a-d to its corresponding filter 408a-d and ultimately to the manifold 404. Backsuction lines 406a-d also connect to the valves 403a-d. In addition, inert gas lines 410a-d connect each with each precursor/reactant gas line 402a-d, downstream of the valves 403a-d but upstream of the filters 408a-d. In the illustrated embodiment, the manifold 404 is mounted by way of a mixer to a diffuser that leads directly into the reactor 412. The manifold 404 can also be mounted directly onto the reactor 412.

Figure 10:
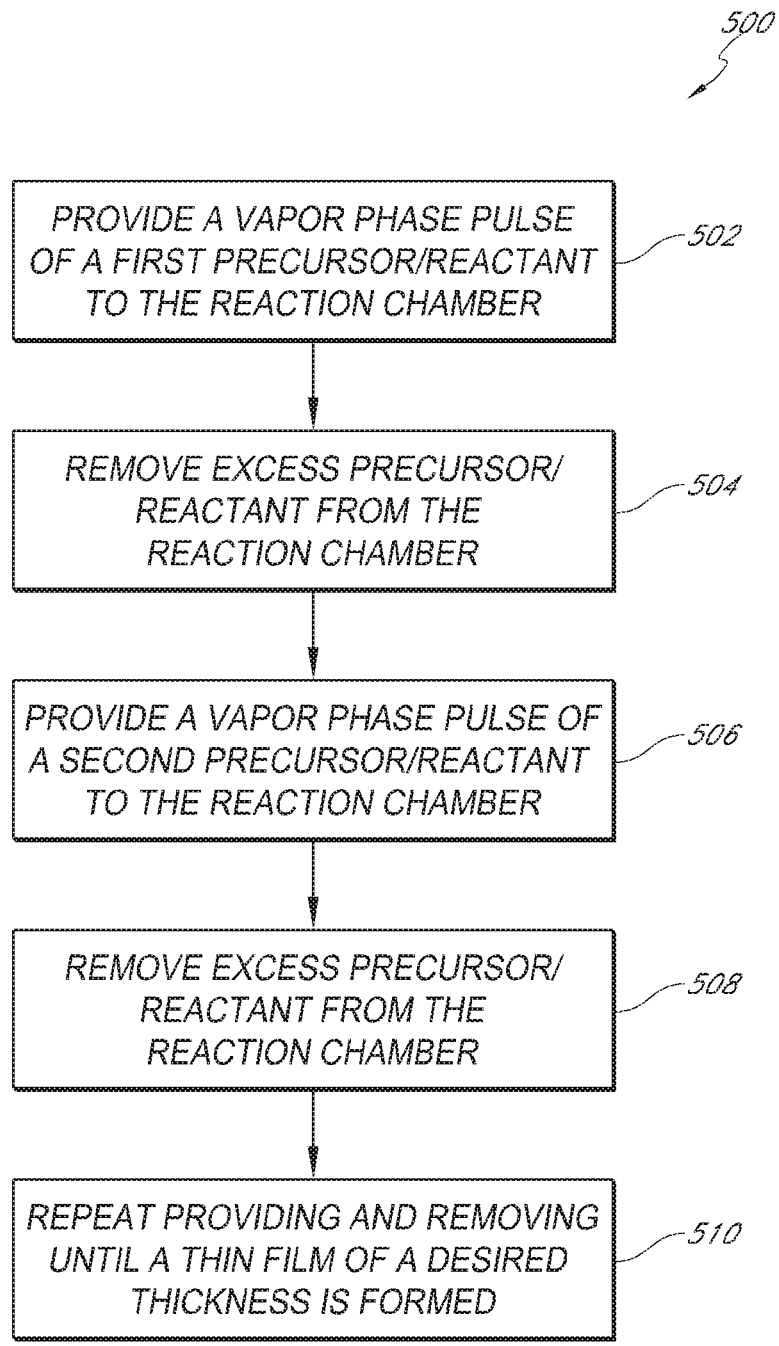
FIG. 10 is a flow chart generally illustrating a method for forming a thin film in accordance with one embodiment.

FIG. 10 is a flow chart generally illustrating a method 500 for forming a thin film in accordance with one embodiment. At block 502, a vapor phase pulse of a first precursor/reactant can be provided to the reaction chamber. At block 504, any excess of the first precursor/reactant can be removed from the reaction chamber. At block 506, a vapor phase pulse of a second precursor/reactant can be provided to the reaction chamber. At block 508, any excess of the second precursor/reactant (along with any reaction byproducts, if any) can be removed from the reaction chamber. Blocks 502-508 can together be referred to as a deposition cycle, and of course the cycle can include additional pulses of additional precursors or reactants. At block 510, the deposition cycle can be repeated until a film of a desired thickness is formed. In some embodiments, the process 500 can be controlled by a control system, as described above for the controller or control system 12 of FIG. 1, which may include a computer having one or more processors executing control programming information (e.g., defining the sequence and parameters of each precursor, reactant, and purge step) stored in memory.

In some embodiments, precursors/reactants (and reaction by-products, if any) can be removed from the reaction chamber by stopping the flow of a precursor/reactant while purging the chamber, e.g., by continuing the flow of an inert carrier gas such as nitrogen or argon. In some embodiments, the removal step can include supplying an inert gas to the precursor/reactant line at a connection point upstream of the point of entry into the reaction chamber, and applying backsuction to the precursor/reactant line upstream (relative to the reactant flow) of the connection point. Applying backsuction to the precursor/reactant line in such a configuration can create a reverse flow of precursor/reactant through the section of the precursor/reactant line between the connection to the backsuction and the connection to the inert gas supply, thereby creating a diffusion barrier and preventing any precursor/reactant from diffusing forward (i.e., toward the reaction chamber) between precursor/reactant pulses.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. An atomic layer deposition (ALD) device comprising:
a horizontal-flow reactor;
a gas distribution system configured to deliver gas to the reactor, the gas distribution system including a first inert gas valve configured to control a supply of an inert gas to the reactor and a first reactant gas valve configured to control a supply of a first reactant gas to the reactor through a first passageway, the first inert gas valve and the first reactant gas valve disposed directly over the reactor within a footprint of the reactor to provide a thermal pathway between the reactor and the first inert gas valve and between the reactor and the first reactant gas valve, the gas distribution system further comprising multiple gas flow paths that merge at a merger point to form a common flow path into the reactor, the merger point disposed directly above the reactor;
a diffuser disposed directly over the reactor, the diffuser being configured to receive gases from the gas distribution system and deliver a broadened flow to the reactor downstream of the diffuser for horizontal flow through the reactor;
a manifold disposed over the reactor;
a mixer disposed directly over the reactor and in communication with the gas distribution system, the mixer disposed between the diffuser and the manifold, the manifold mounted to the diffuser by way of the mixer;
a common heating system configured to heat the reactor, the first inert gas valve, and the first reactant gas valve; and
a gas pathway in which gas is delivered horizontally through the gas distribution system, the manifold, the mixer, and the diffuser over the reactor, vertically downward from the gas distribution system, the manifold, the mixer, and the diffuser to an inlet flange of the reactor, the inlet flange disposed at a side portion of the reactor and positioned to direct a flow of gas horizontally through the reactor across an upper surface of a substrate.

2. The ALD device of claim 1, wherein the gas distribution system comprises:
a second reactant gas valve configured to control a supply of a second reactant gas to the reactor through a second passageway; and
a second inert gas valve configured to control a supply of an inert gas to the reactor.

3. The ALD device of claim 2, further comprising a controller configured to control the first and second reactant gas valves and the first and second inert gas valves to accomplish a sequence in which a vapor phase pulse of the first reactant gas is provided to the reactor, an excess of the first reactant gas is removed from the reaction chamber, a vapor phase pulse of the second reactant gas is provided to the reactor, an excess of the second reactant gas is removed from the reaction chamber, and in which the providing and removing steps are repeated until a thin film of a desired thickness is formed.

4. The ALD device of claim 1, wherein the first inert gas valve is configured to deliver the supply of inert gas to the first passageway at a first location upstream of the reactor.

5. The ALD device of claim 4, wherein the gas distribution system includes a first backsuction line in flow communication with the first passageway at a second location upstream of the reactor, the second location being farther upstream than the first location.

6. The ALD device of claim 5, wherein the gas distribution system includes a first backsuction valve configured to control the application of suction to the first backsuction line.

7. The ALD device of claim 6, wherein the first and second reactant gas valves, the first and second inert gas valves, and the first backsuction valve are mounted, directly or indirectly, to the reactor.

8. The ALD device of claim 1, wherein the gas distribution system and the reactor are positioned within a vacuum chamber.

9. The ALD device of claim 1, wherein the gas distribution system includes a first filter mounted over the reactor, the first filter being configured to filter a supply of a first reactant gas before it enters the reactor.

10. The ALD device of claim 1, wherein the first reactant gas valve and the first inert gas valve are positioned sufficiently close to the reactor so as to be heated by the reactor's heating system and to avoid condensation of a reactant gas without any separate heating system.

11. The ALD device of claim 1, wherein the gas distribution system provides inert gas valving (IGV) including a diffusion barrier between the first reactant gas valve and the first inert gas valve.

12. The ALD device of claim 11, wherein the gas distribution system includes a plurality of reactant gas valves and a plurality of backsuction valves configured to provide the inert gas valving (IGV).

13. The ALD device of claim 12, wherein the plurality of reactant gas valves and the plurality of backsuction valves include valve seats.

14. The ALD device of claim 13, wherein a distance between the valve seats and the merger point being between about 10 mm and 100 mm.

15. The ALD device of claim 12, wherein the plurality of reactant gas valves and the plurality of backsuction valves are rated for operation at a temperature of at least 220° C.

16. The ALD device of claim 12, wherein the common heating system is configured to heat the plurality of backsuction valves.

17. The ALD device of claim 12, wherein the manifold is disposed downstream of and in fluid communication with the plurality of reactant gas valves and the plurality of backsuction valves.

18. The ALD device of claim 17, wherein the plurality of reactant gas valves and the plurality of backsuction valves are mounted on the manifold.

19. An atomic layer deposition (ALD) device comprising:
a horizontal-flow reactor;
a gas distribution system configured to deliver gas to the reactor, the gas distribution system disposed directly over the reactor within a footprint of the reactor to provide a thermal pathway between the reactor and the gas distribution system, the gas distribution system including at least one inert gas valve, reactant valves, and backsuction valves configured to provide inert gas valving (IGV), the gas distribution system further comprising multiple gas flow paths that merge at a merger point to form a common flow path into the reactor, the merger point disposed directly above the reactor;
a diffuser disposed directly over the reactor, the diffuser being configured to receive gases from the gas distribution system and deliver a broadened flow to the reactor downstream of the diffuser for horizontal flow through the reactor;
a manifold disposed over the reactor;
a mixer disposed between the manifold and the diffuser, the manifold mounted to the diffuser by way of the mixer;
a common heating system configured to heat the reactor, the at least one inert gas valve, the reactant valves, and the backsuction valves; and
a gas pathway that delivers gas horizontally through the gas distribution system the manifold, the mixer, and the diffuser over the reactor, vertically downward from the gas distribution system, the manifold, the mixer, and the diffuser to an inlet flange of the reactor, the inlet flange disposed at a side portion of the reactor and positioned to direct a flow of gas horizontally through the reactor across an upper surface of a substrate.

20. The ALD device of claim 19, further comprising a filter disposed directly over the reactor.

21. An atomic layer deposition (ALD) device comprising:
a horizontal-flow reactor;
a gas distribution system configured to deliver gas to the reactor, the gas distribution system including at least one of a valve and a filter disposed directly over the reactor to provide a thermal pathway between the reactor and the at least one of the valve and the filter;
a diffuser disposed directly over the reactor, the diffuser being configured to receive gases from the gas distribution system and deliver a broadened flow to the reactor downstream of the diffuser for horizontal flow through the reactor;
a manifold mounted to the diffuser directly over the reactor between the diffuser and the at least one of the valve and the filter; and
a gas pathway in which gas is delivered horizontally through the gas distribution system, the manifold, and the diffuser over the reactor, vertically downward from the gas distribution system, the manifold, and the diffuser to an inlet flange of the reactor, and horizontally through the reactor.

22. The ALD device of claim 21, further comprising a mixer disposed between the manifold and the diffuser, the manifold mounted to the diffuser by way of the mixer.

* * * * *